United States Patent
Lammert

Patent Number: 5,804,487
Date of Patent: Sep. 8, 1998

[54] METHOD OF FABRICATING HIGH βHBT DEVICES

[75] Inventor: Michael D. Lammert, Manhattan Beach, Calif.

[73] Assignee: TRW Inc., Redondo Beach, Calif.

[21] Appl. No.: 676,697

[22] Filed: Jul. 10, 1996

[51] Int. Cl.⁶ .................................................. H01L 21/331
[52] U.S. Cl. .................... 438/319; 438/321; 438/606; 438/926; 438/944; 438/945; 438/951
[58] Field of Search ..................... 438/312, 319, 438/320, 321, 606, 604, 926, 944, 945, 951; 148/DIG. 72, DIG. 100; 257/200

[56] References Cited

U.S. PATENT DOCUMENTS

| | | |
|---|---|---|
| 4,818,712 | 4/1989 | Tully . |
| 4,889,831 | 12/1989 | Ishii et al. ................... 437/184 |
| 4,965,650 | 10/1990 | Inada et al. . |
| 5,106,766 | 4/1992 | Lunardi et al. ............... 437/31 |
| 5,124,270 | 6/1992 | Morizuka . |
| 5,153,692 | 10/1992 | Morizuka . |
| 5,159,423 | 10/1992 | Clark et al. . |
| 5,166,081 | 11/1992 | Inada et al. . |
| 5,208,184 | 5/1993 | Bayraktaroglu ............. 437/132 |
| 5,252,500 | 10/1993 | Sato . |
| 5,272,095 | 12/1993 | Enquist et al. . |
| 5,283,448 | 2/1994 | Rayraktaroglu . |
| 5,298,439 | 3/1994 | Liu et al. ................... 437/31 |
| 5,318,916 | 6/1994 | Enquist et al. . |
| 5,324,671 | 6/1994 | Bayraktaroglu . |
| 5,344,786 | 9/1994 | Bayraktaroglu ............. 437/31 |
| 5,411,632 | 5/1995 | Delage et al. . |
| 5,446,294 | 8/1995 | Bayraktaroglu . |
| 5,468,659 | 11/1995 | Hafizi et al. . |
| 5,471,078 | 11/1995 | Bayraktaroglu . |
| 5,485,025 | 1/1996 | Chau et al. . |
| 5,486,483 | 1/1996 | Lammert . |
| 5,512,496 | 4/1996 | Chau et al. ............... 148/DIG. 72 |

FOREIGN PATENT DOCUMENTS

| | | |
|---|---|---|
| 055800 | 3/1987 | European Pat. Off. . |
| 0525762 | 7/1992 | European Pat. Off. . |
| 06045347 | 2/1994 | Japan . |

Primary Examiner—John Niebling
Assistant Examiner—Long Pham
Attorney, Agent, or Firm—Michael S. Yatsko

[57] ABSTRACT

A method for controlling the spacing between the emitter mesa and the base ohmic metal of a heterojunction bipolar transistor (HBT) to obtain a relatively high gain (β) with a low-parasitic base resistance. In a first method, after the emitter, base and collector layers are epitaxially grown on a substrate, a sacrificial layer is deposited on top of the emitter layer. The emitter mesa is patterned with a photoresist using conventional lithography. Subsequently, the sacrificial layer is etched to produce an undercut. The emitter layer is then etched and a photoresist is applied over the first photoresist used to pattern the emitter mesa, as well as the entire device. The top layer of photoresist is patterned with a conventional process for lift-off metalization, such that the final resist profile has a re-entrant slope. The base ohmic metal is deposited and then lifted off by dissolving both the second layer of photoresist, as well as the original photoresist over the emitter mesa. The sacrificial layer is stripped using an isotropic etch leaving a base ohmic metal region surrounding an emitter mesa at a spacing that is determined by the initial undercut of the sacrificial layer. In an alternate embodiment of the invention, a method is disclosed for controlling the spacing between the base ohmic metal and an emitter ohmic metal.

15 Claims, 4 Drawing Sheets

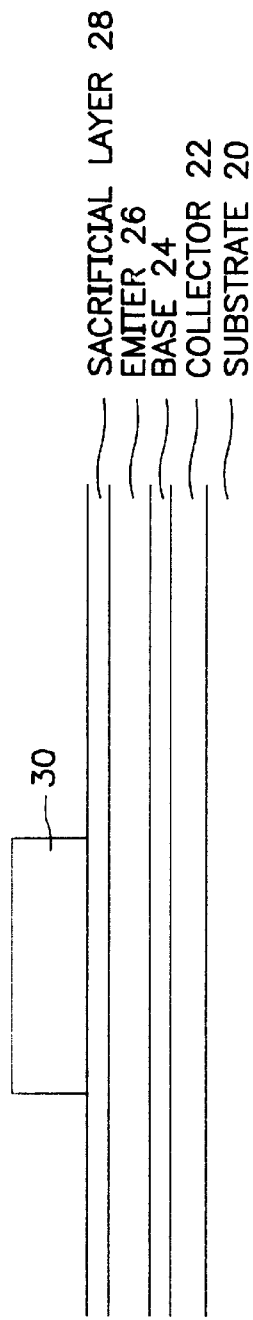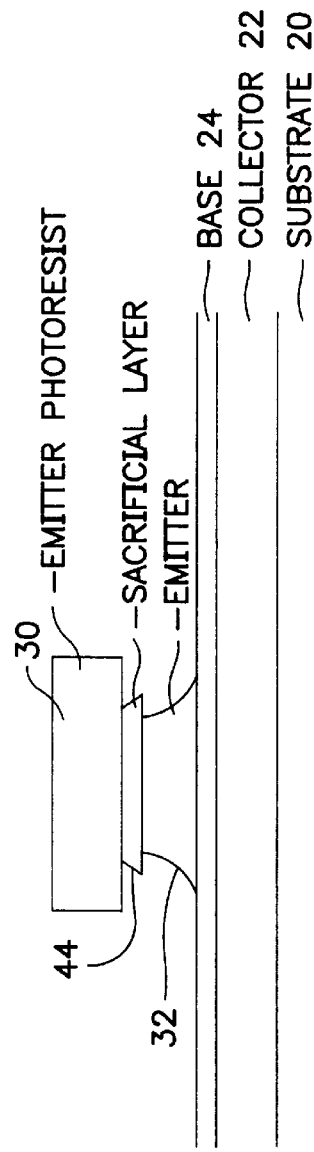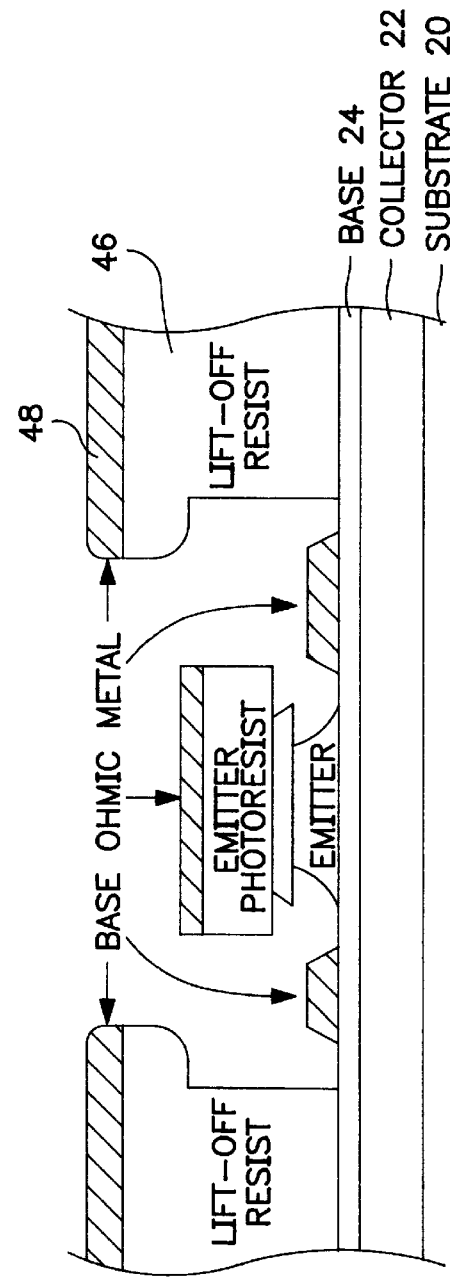

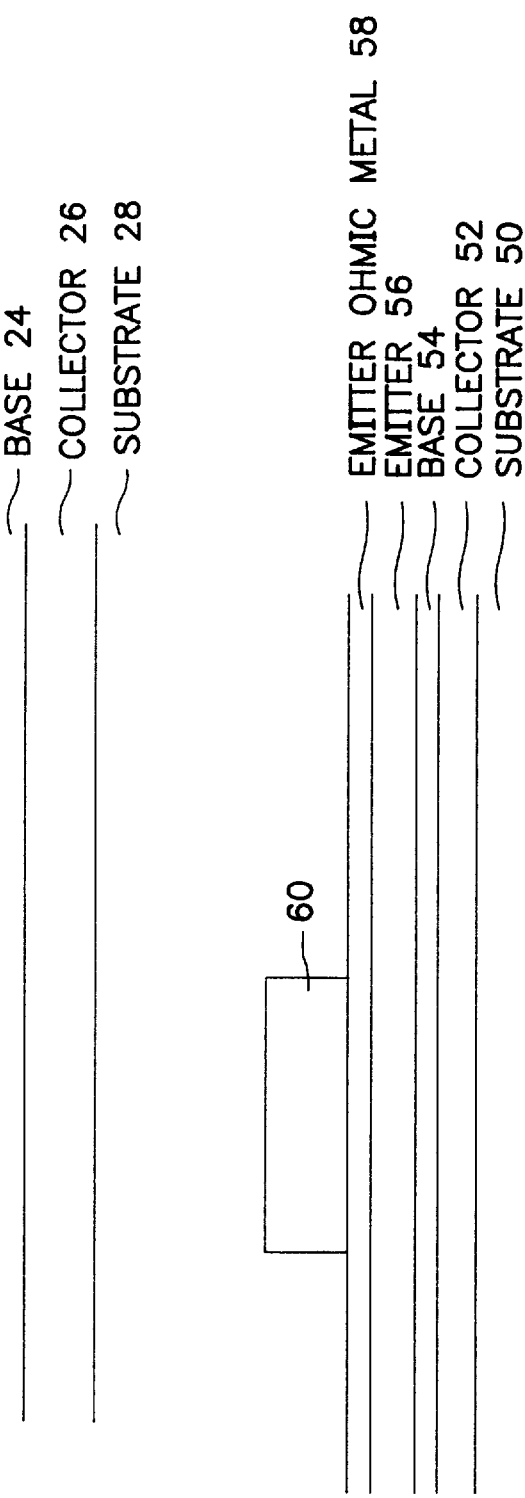
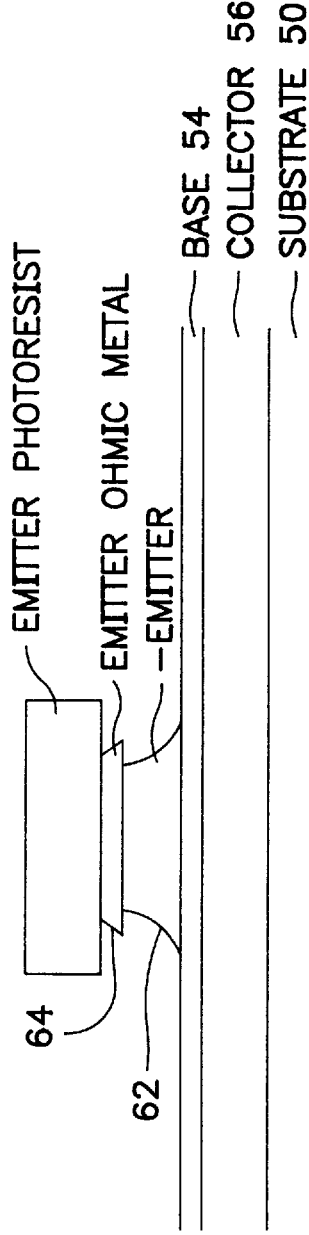
FIG. 4
FIG. 5
FIG. 6

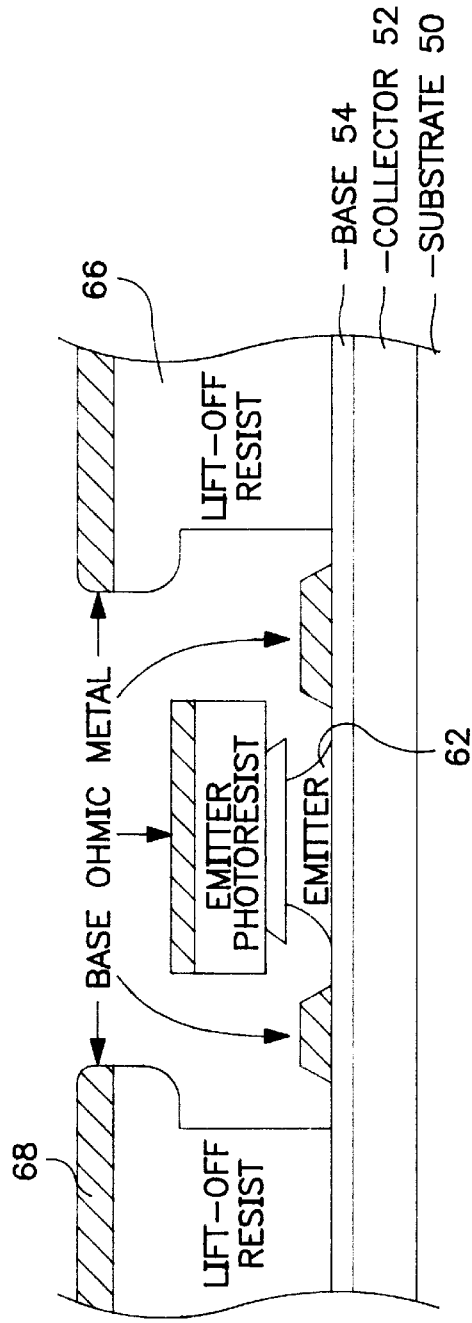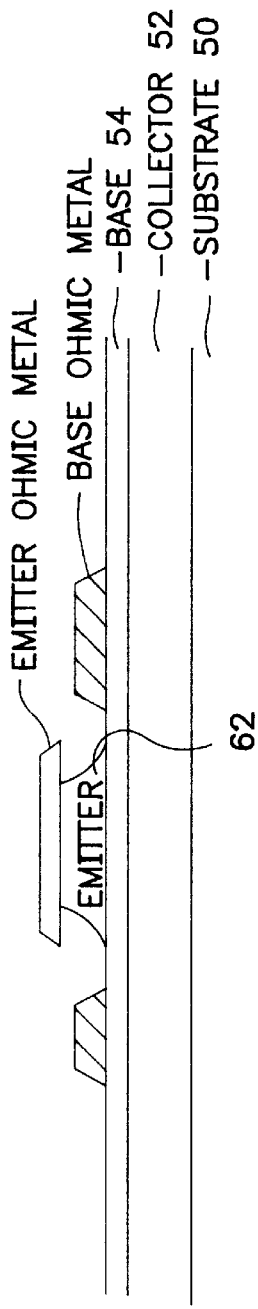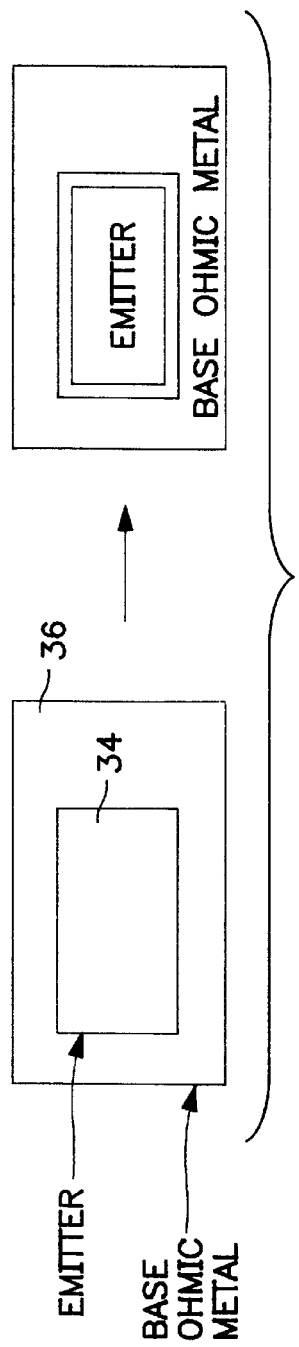

METHOD OF FABRICATING HIGH βHBT DEVICES

This invention was developed during the course of Contract or Subcontract No. N66001-92-C-6018 for the Department of Defense.

BACKGROUND OF THE INVENTION

1. Field of the Invention

The present invention relates to a method for fabricating integrated circuits and more particularly to a method for achieving controllable spacing between the emitter mesa and the base ohmic metal of a heterojunction bipolar transistor (HBT).

2. Description of the Prior Art

Heterojunction bipolar transistors (HBT's) are known in the art. Examples of methods of fabricating such HBT's are disclosed in U.S. Pat. Nos. 5,159,423; 5,272,095; 5,411,632; 5,446,294; 5,468,659; and 5,485,025. Such HBT's normally include a substrate, as well as epitaxially grown collector, base and emitter layers known to be formed by various methods, including molecular beam epitaxy. Such HBT's are normally formed with an emitter mesa, normally formed by well-known photolithography techniques. Known metalization techniques are used to form ohmic metal contacts on the emitter mesa, as well as the base.

It is known in the art that the base ohmic metal spacing to the emitter mesa is relatively critical to the device performance. In particular, if the base ohmic metal is deposited too close to the emitter mesa, a potential leakage path between the base and the emitter can be created, resulting in degradation of the gain (β) of the device. Should the spacing between the base ohmic metal and emitter mesa be too large, the parasitic base resistance of the device will be too large, thereby degrading the performance of the HBT.

Various methods are known for controlling the spacing of ohmic contacts for various integrated circuits, including HBT's. Various methods rely on self-alignment of the base ohmic metal and the emitter mesa. For example, one known self-alignment method relies on etching the emitter with an emitter photoresist layer and retaining that layer during the patterning of the lift-off of the photoresist for the base ohmic metal. However, it is known that the spacing between the base ohmic metal and the emitter mesa is not controllable with such a method.

Another known method for controlling the spacing between the base ohmic metal and the emitter mesa relies on so-called spacer technology, frequently used in silicon processing. In that method, the emitter mesa is anisotropically etched. After the emitter mesa is formed, a spacer layer is deposited and anisotropically etched. A base ohmic metal is patterned and lifted off by conventional techniques, except from over the spacer and emitter. The removal of the base ohmic metal from the spacer and emitter is known to done by ion milling. Unfortunately, damage from the anisotropic etches and the high-defect density usually encountered in the ion milling process limit the usefulness of this type of spacer technology.

Other methods for controlling the spacing between the emitter mesa and the base ohmic contacts are disclosed in U.S. Pat. Nos. 5,124,270; 5,159,423; 5,411,632; 5,446,294; 5,468,659; and 5,486,483. Although the methods described in these patents do provide some control of the spacing between the base ohmic metal and the emitter mesa, the methods disclosed are relatively complex and involve quite a few process steps.

SUMMARY OF THE INVENTION

It is an object of the present invention to provide a method for controlling the spacing between the emitter mesa and base ohmic metal that solves the problem of the prior art.

It is yet another object of the present invention to provide a method for controlling the spacing between the emitter mesa and base ohmic metal on a relatively uniform basis.

Briefly, the present invention relates to a method for controlling the spacing between the emitter mesa and the base ohmic metal of a heterojunction bipolar transistor (HBT) to obtain a relatively high gain (β) with a low-parasitic base resistance. In a first method, after the emitter, base and collector layers are epitaxially grown on a substrate, a sacrificial layer is deposited on top of the emitter layer. The emitter mesa is patterned with a photoresist using conventional lithography. Subsequently, the sacrificial layer is etched to produce an undercut. The emitter layer is then etched, and a photoresist is applied over the first photoresist used to pattern the emitter mesa, as well as the entire device. The top layer of photoresist is patterned with a conventional process for lift-off metalization, such that the final resist profile has a re-entrant slope. The base ohmic metal is deposited and then lifted off by dissolving both the second layer of photoresist, as well as the original photoresist over the emitter mesa. The sacrificial layer is stripped using an isotropic etch leaving a base ohmic metal region surrounding an emitter mesa at a spacing that is determined by the initial undercut of the sacrificial layer. In an alternate embodiment of the invention, a method is disclosed for controlling the spacing between the base ohmic metal and an emitter ohmic metal.

BRIEF DESCRIPTION OF THE DRAWING

These and other objects of the present invention will be readily understood with reference to the following specification and attached drawing, wherein:

FIGS. 1–4 are sectional views of a heterojunction bipolar transistor (HBT), showing the successive steps in the method in accordance with the present invention for controlling the spacing between the base ohmic metal and the emitter mesa;

FIGS. 5–8 are sectional views of an HBT, showing the successive steps in an alternate embodiment of the invention for controlling the spacing between the base ohmic metal and the emitter ohmic metal; and FIGS. 9–12 illustrate the photomasks and resulting spacing of the emitter or emitter metal relative to the base ohmic metal for self-alignment of the four, three, two and one sides of the emitter, respectively.

DETAILED DESCRIPTION OF THE INVENTION

Figure 10:
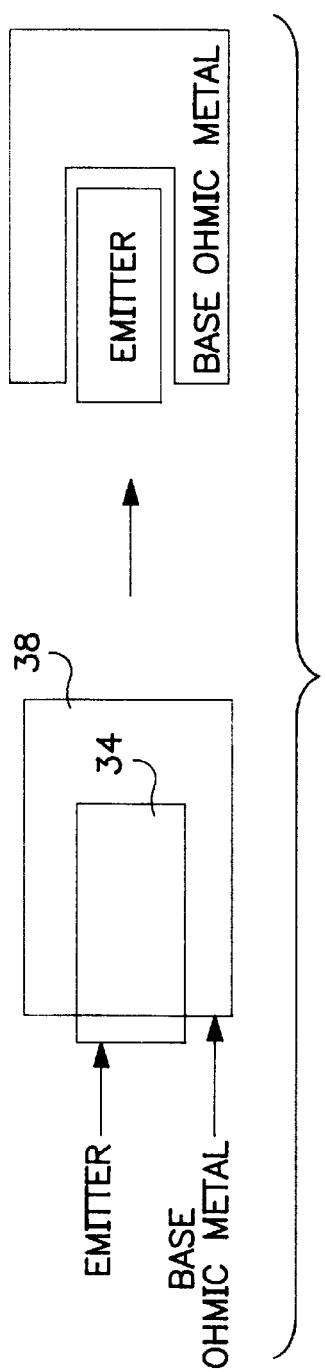
Figure 11:
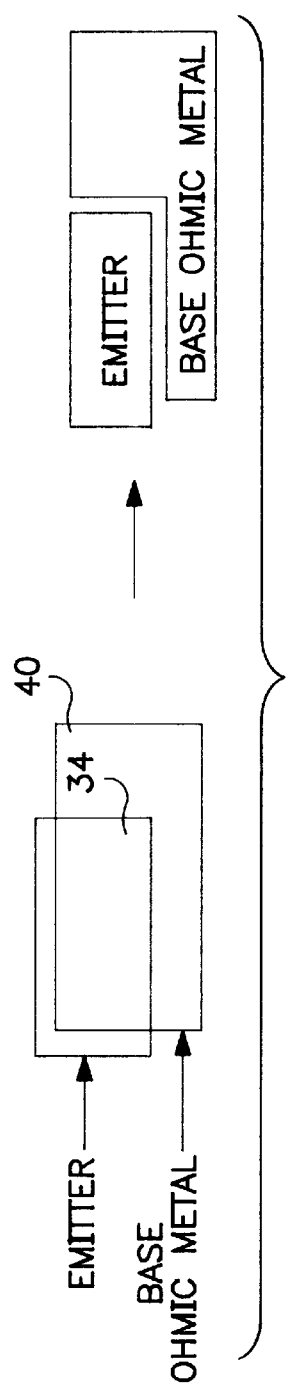
Figure 12:
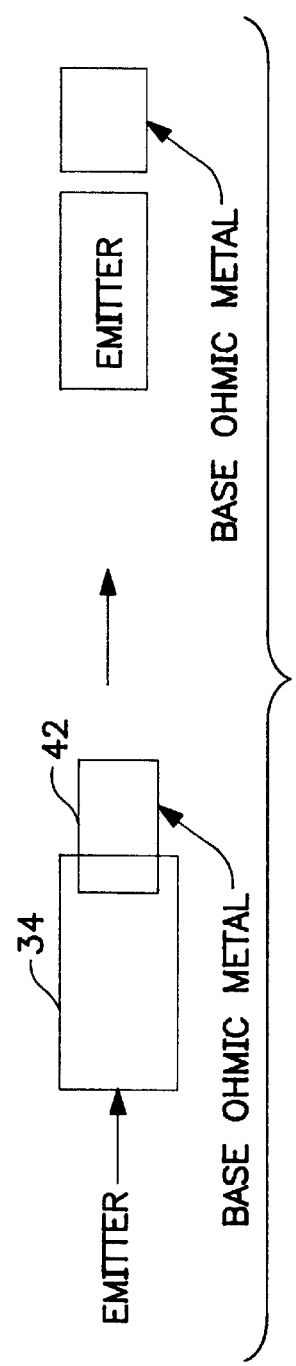

The present invention relates to a heterojunction bipolar transistor (HBT) and, in particular, to a method for controlling the spacing of the base ohmic metal relative to either the emitter mesa or the emitter ohmic metal. More particularly, in a first embodiment of the invention, a method is disclosed for self-alignment of the base ohmic metal relative to the emitter mesa. The first method is illustrated in FIGS. 1–4. The second method relates to self-alignment of the base ohmic metal relative to the emitter ohmic metal, as illustrated in FIGS. 5–8. FIGS. 9–12 illustrate that both methods, in accordance with the present invention, can be used to form uniform spacing between the base ohmic metal and either the emitter mesa or emitter ohmic metal on all four sides of the emitter mesa, or one, two or three sides of the emitter mesa, as shown.

As will be appreciated by those of ordinary skill in the art, the methods, in accordance with the present invention, can also be used to provide self-alignment of base ohmic metal on HBT devices having multiple emitters. Moreover, although the invention is described and illustrated for controlling the spacing between the base ohmic metal and an emitter mesa or emitter ohmic metal layer on an HBT device, the principles of the present invention are applicable to other devices where it is desired to place a metal at a relatively close and controllable spacing to another feature or metal layer on the device.

Turning to FIGS. 1–4, a method is illustrated for providing a uniform and reproducible method for spacing the base ohmic metal relative to an emitter mesa on an HBT. As shown in FIG. 1, the HBT includes a substrate 20 and a plurality of vertically stacked epitaxial layers. For example, a collector layer 22, base layer 24 and emitter layer are epitaxially formed on the substrate 20, for example by molecular beam epitaxy (MBE). Each of these layers may be formed of two, three or more epitaxial layers. A sacrificial layer 28 is deposited on top of the emitter layer 26. Various dielectric films are suitable for the sacrificial layer, such as $Si_3N_4$, $SiO_2$ or $Al_2O_3$. In addition to dielectric films, various organic films or metal films may also be used for the sacrificial layer 28. In order to be suitable for the method, the organic films and metal films must be able to be etched isotropically with good selectivity to both the emitter resist and the emitter semiconductor layer, as well as be able to be etched with a uniform undercut and not attacked by an emitter etchant. The thickness of the sacrificial layer is chosen to enhance the control of an undercut to be described below.

After the sacrificial layer 28 is deposited on the emitter layer 26, an emitter photoresist 30 is spun onto the sacrificial layer 28 to form an emitter mesa 32. The emitter photoresist 30 is patterned using conventional lithography. In particular, a photomask 34 (FIGS. 9–12) is used for patterning the emitter photoresist 30 to form the emitter mesa 32. As shown in FIGS. 9–12, various photomasks 36, 38, 40 and 42 can be used to pattern the base ohmic metal to create self-alignment of the emitter mesa or emitter metal along four, three, two or one side of the emitter mesa or emitter metal. The photomask 34 is disposed adjacent the emitter photoresist 30 and exposed with ultraviolet light. After development of the photoresist by conventional techniques, emitter photoresist 30 is formed as shown in FIG. 1.

The type of photoresist used for the emitter photoresist 30 must be compatible with the base ohmic metal lift-off process. For example, if a conventional positive photoresist material is used for the base ohmic metal lift-off process, the emitter photoresist 30 should be either a non-reacting resist, such as polymethylmethacrylate (PMMA), or a conventional photoresist that is hardened by a process, such as by deep ultraviolet (DUV) exposure or e-beam flood exposure, or a high-temperature photoresist that can be hardened by high-temperature baking. If a dual-layer photoresist is used for the base ohmic metal lift-off, such as coating a layer of PMMA by conventional positive photoresist, then the emitter photoresist material can be any conventional positive photoresist that has been hardened by high-temperature baking before the device is coated for the base ohmic metal resist process, so that it will not be distorted during the processing of the dual layer photoresist.

Once the emitter photoresist 30 is formed as shown in FIG. 1, the sacrificial layer 28 is etched isotropically to produce an undercut 44 (FIG. 2) in the sacrificial layer 28. The sacrificial layer 28 may also be etched with a combined isotropic and anisotropic etch to produce the undercut 44. An important aspect of the invention is that the undercut 44 of the sacrificial layer 28 determines the spacing of the base ohmic metal relative to the emitter mesa 32. Once the undercut 44 is formed in the sacrificial layer 28, the emitter layer 26 is etched with an isotropic (or mostly isotropic) etch, exposing a portion of the base layer 24. With the emitter photoresist 30 in place, the device is recoated with a photoresist (lift-off photoresist) 46 to form the pattern of the base ohmic metal. The lift-off photoresist 46 is patterned to have a final profile with a re-entrant slope formed on the exposed base layer 24 as shown in FIG. 3. The re-entrant slope controls the outer perimeter of the base ohmic metal pattern. Various processes may be used for patterning the lift-off resist 46. For example, the photoresist 46 may be formed using a surface treatment of a conventional photoresist with chlorobenzene. Other processes for patterning the lift-off photoresist 46 include: a dual-layer resist, which consists of a conventional positive photoresist over a second layer of resist, such as PMMA; a negative i-line resist; or a positive resist used with image reversal. All such processes are suitable for patterning the lift-off resist 46 with a re-entrant slope as illustrated in FIG. 3.

If the base ohmic metal lift-off pattern is defined with the dual-layer resist process, such as coating of PMMA followed by conventional positive resist, then the emitter resist can be any conventional positive resist that has been hardened to the point where it will not become distorted in the processing of the base dual layer ohmic metal resist process. The simplest material for the emitter resist is a high-temperature resist that is hardened with a high-temperature bake before the wafers are coated for the base ohmic metal resist process.

After the lift-off resist 46 is patterned with a reentrant slope, the base ohmic metal 48 is deposited, for example, by evaporation. As shown in FIG. 3, the base ohmic metal 48 is deposited on the emitter photoresist 30, as well as over the lift-off photoresist 46. The undercut 44 on the sacrificial layer 28 controls the spacing of the base ohmic metal deposited on the base layer 24 to provide uniform and controllable spacing relative to the emitter mesa 32 to provide HBT's with a relatively high gain (β) with a relatively low parasitic resistance. The base ohmic metal on the emitter photoresist 30, as well as the lift-off photoresist 46, is lifted off by dissolving both the emitter photoresist 30, as well as the liftoff photoresist 46. After lift-off of the base ohmic metal 48, the sacrificial layer 28 is stripped using an isotropic etch, leaving a base ohmic metal region 49 (FIG. 4) spaced relative to the emitter mesa 32 as determined by the undercut 44 of the sacrificial layer 38.

In an alternate embodiment of the invention, an oxygen plasma descum may be used prior to the evaporation of the base ohmic metal to enhance the adhesion of the metal. If an oxygen plasma descum is used, the final base ohmic metal to emitter mesa spacing is determined by the undercut 44 of the sacrificial layer 28, as well as the amount of photoresist removed in the plasma descum from the sidewalls of the emitter photoresist 30.

A method for controlling the spacing of the base ohmic metal relative to the emitter ohmic metal is disclosed in FIGS. 5–8. In this method, a collector layer 52, base layer 54 and an emitter layer 56 are epitaxially grown on a substrate layer 50, for example, by molecular beam epitaxy. An emitter ohmic metal 58, which may be a single metal layer or a combination of metal layers, is deposited on the emitter layer 56. Suitable metals for the emitter ohmic metal 58 include titanium (Ti), titanium tungsten (TiW), tungsten (W) and titanium nitride (TiN), molybdenum (Mo), or other metal that has the properties of achieving low contact resistance relative to the emitter layer 56, will not interfere with the etching of the emitter mesa, able to be etched isotropically with good selectivity to both the emitter resist and emitter layer 56, able to be etched with a uniform undercut, and not being attacked by the emitter etchant.

After the emitter ohmic metal 58 is deposited on the emitter layer 56, an emitter photoresist 60 is patterned as discussed above to form an emitter mesa 62, as shown in FIG. 5. The emitter ohmic metal layer 58 is etched with an isotropic or combined anisotropic and isotropic etch process, using an over etch of the metal to establish an undercut 64 used to self-align the spacing between the emitter ohmic metal and the base ohmic metal, as shown in FIG. 6.

The remaining steps in the method are identical to the method described above, except the emitter ohmic metal 58 over the emitter mesa 62 is not stripped after the base ohmic metal lift-off. Briefly, a lift-off photoresist 66 is spun onto the device and patterned with a conventional process for lift-off metalization as discussed above, forming a final profile of the lift-off photoresist 66 with a re-entrant slope as discussed above. Base ohmic metal 68 is then deposited, for example by evaporation, leaving base ohmic metal on the lift-off photoresist 66, the emitter photoresist 60, as well as a pattern of base ohmic metal on the base layer 54, surrounding the emitter mesa 62. As discussed above, the spacing between the base ohmic metal on the base layer 54 and the emitter mesa 62 is controlled by the undercut 64, formed in the emitter ohmic metal 58. The base ohmic metal on the emitter photoresist 60, as well as over the lift-off photoresist 66 is stripped off, leaving the emitter ohmic metal 58, formed on the emitter mesa 62, and base ohmic metal on the base layer 54, uniformly and controllably spaced, relative to the emitter ohmic metal 58 by way of the undercut 64 in emitter ohmic metal 58.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A method for aligning a metal and an emitter mesa, on an integrated circuit formed with a substrate and a plurality of vertically stacked epitaxial layers thereupon, defining a top exitaxial layer, the emitter mesa being disposed on top of the epitaxial layers, the method comprising the steps of:
   (a) depositing a layer of material on said top epitaxial layer;
   (b) depositing a first photoresist on said top epitaxial layer and said emitter mesa;
   (c) patterning and developing said first photoresist to define an emitter mesa on said top epitaxial layer;
   (d) etching said material to produce an undercut;
   (e) etching said top epitaxial layer to form said object;
   (f) depositing a second photoresist on said top exitaxial layer and said emitter mesa;
   (g) patterning and developing said second photoresist on said integrated circuit to define a re-entrant slope relative to said emitter mesa;
   (h) depositing a metal on said integrated circuit to form an ohmic contact; and
   (i) lifting off said metal, as well as said first photoresist and said second photoresist leaving an metal region around said emitter mesa that is uniformly spaced relative to said emitter mesa.

2. A method as recited in claim 1, wherein said layer of material is a sacrificial layer.

3. A method as recited in claim 2, wherein said layer of said material is a dielectric film.

4. A method as recited in claim 1, wherein said dielectric film is selected from the group of $Si_3N_4$, $SiO_2$ and $Al_2O_3$.

5. A method as recited in claim 1, wherein said layer of said material is an ohmic metal layer.

6. A method as recited in claim 5, wherein said material is selected from the group of Ti, TiW, W and TiN.

7. A method for aligning a base metal relative to an emitter mesa on a heterojunction bipolar transistor (HBT) having a substrate and a plurality of vertically stacked epitaxial layers thereupon including a base layer, a collector layer and an emitter layer, said emitter layer being formed on top, the method comprising the steps of:
   (a) depositing a sacrificial layer on top of said emitter layer;
   (b) depositing a first photoresist on top of said sacrificial layer;
   (c) patterning and developing a first photoresist on top of said sacrificial layer to form an emitter mesa;
   (d) etching said sacrificial layer to form an undercut;
   (e) etching said emitter layer to form said emitter mesa and expose a portion of said base layer;
   (f) depositing a second photoresist over said first photoresist and said base layer;
   (g) patterning and developing a second photoresist over said first photoresist and said exposed portion of said base layer with a re-entrant slope adjacent said exposed portion of said base layer;
   (h) depositing a base metal on said first photoresist, said second photoresist and said exposed portion of said base layer; and
   (i) lifting off said base metal deposited on said first and second photoresists along with said first and second photoresists leaving a base metal region around the emitter mesa whose spacing therefrom is determined by the undercut in said sacrificial layer.

8. The method as recited in claim 7, wherein said sacrificial layer is a dielectric film.

9. The method as recited in claim 8, wherein said dielectric film is selected from the group of $Si_3N_4$, $SiO_2$ and $Al_2O_3$.

10. The method as recited in claim 7, wherein said sacrificial layer is an organic film.

11. The method as recited in claim 7, wherein said sacrificial layer is a metal film.

12. The method as recited in claim 7, wherein said etching of said sacrificial layer is isotropic etching.

13. The method as recited in claim 7, wherein said etching of said sacrificial layer is combined isotropic and anisotropic etching.

14. The method as recited in claim 7, wherein said etching of said emitter layer includes isotropic etching.

15. A method for aligning a base metal relative to an emitter mesa on a heterojunction bipolar transistor having a substrate and a plurality of vertically stacked epitaxial layers thereupon including a base layer, a collector layer and an emitter layer, the method comprising the steps of:
   (a) depositing an emitter metal on top of said emitter layer;

(b) depositing a first photoresist on top of said emitter layer and said emitter metal;

(c) patterning and developing said first photoresist on top of said emitter metal to form an emitter mesa;

(d) etching said emitter metal to form an undercut;

(e) etching said emitter layer to form said emitter mesa and exposing a portion of said base layer;

(f) depositing a second photoresist on said emitter mesa and said base layer;

(g) patterning said second photoresist over said first photoresist and said exposed portion of said base layer with a re-entrant slope adjacent said exposed portion of said base layer;

(h) depositing a base metal on said first photoresist, said second photoresist and said exposed portion of said base layer; and (i) lifting off said base metal deposited on said first and second photoresists along with said first and second photoresists leaving a base metal region around the emitter mesa whose spacing therefrom is determined by the undercut in said emitter metal.

* * * * *